United States Patent
Surthi et al.

(10) Patent No.: US 9,041,099 B2
(45) Date of Patent: May 26, 2015

(54) SINGLE-SIDED ACCESS DEVICE AND FABRICATION METHOD THEREOF

(75) Inventors: Shyam Surthi, Boise, ID (US); Sheng-Wei Yang, Taoyuan County (TW)

(73) Assignee: NANYA TECHNOLOGY CORP., Taoyuan (TW)

(*) Notice: Subject to any disclaimer, the term of this patent is extended or adjusted under 35 U.S.C. 154(b) by 211 days.

(21) Appl. No.: 13/084,533

(22) Filed: Apr. 11, 2011

(65) Prior Publication Data

US 2012/0256259 A1 Oct. 11, 2012

(51) Int. Cl.
*H01L 29/66* (2006.01)
*H01L 27/108* (2006.01)
*H01L 29/78* (2006.01)
*H01L 29/423* (2006.01)
*H01L 29/10* (2006.01)

(52) U.S. Cl.
CPC ..... *H01L 27/10826* (2013.01); *H01L 27/10876* (2013.01); *H01L 27/10879* (2013.01); *H01L 29/66795* (2013.01); *H01L 29/785* (2013.01); *H01L 29/4236* (2013.01); *H01L 29/42372* (2013.01); *H01L 29/1037* (2013.01)

(58) Field of Classification Search
CPC .......... H01L 29/66795; H01L 27/1203; H01L 21/845; H01L 27/1211; H01L 27/10879; H01L 29/4236; H01L 21/82321; H01L 27/10826; H01L 29/66704; H01L 27/11582

USPC .................. 257/329, 330, 334, 401
See application file for complete search history.

(56) References Cited

U.S. PATENT DOCUMENTS

| | | | |
|---|---|---|---|
| 7,408,224 B2 * | 8/2008 | Kim ............................... | 257/331 |
| 7,408,533 B2 * | 8/2008 | Eom et al. ........................ | 345/76 |
| 7,456,476 B2 * | 11/2008 | Hareland et al. .............. | 257/349 |
| 7,573,108 B2 * | 8/2009 | Juengling ...................... | 257/401 |
| 2005/0186740 A1 | 8/2005 | Kim | |
| 2007/0181925 A1 | 8/2007 | Yoon | |
| 2009/0026522 A1 * | 1/2009 | Ananthan ....................... | 257/315 |
| 2009/0085089 A1 * | 4/2009 | Chang et al. .................. | 257/316 |

FOREIGN PATENT DOCUMENTS

WO 2009018486 A1 2/2009

* cited by examiner

*Primary Examiner* — Wael Fahmy
*Assistant Examiner* — Sarah Salerno
(74) *Attorney, Agent, or Firm* — Winston Hsu; Scott Margo

(57) ABSTRACT

The present invention provides a single-sided access device including an active fin structure comprising a source region and a drain region; an insulating layer interposed between the source region and the drain region; a trench isolation structure disposed at one side of the active fin structure; a single-sided sidewall gate electrode disposed on the other side of the active fin structure opposite to the trench isolation structure so that the active fin structure is sandwiched by trench isolation structure and the single-sided sidewall gate electrode; and a gate protrusion laterally and electrically extended from the single-sided sidewall gate electrode and embedded between the source region and the drain region under the insulating layer.

20 Claims, 9 Drawing Sheets

US 9,041,099 B2

SINGLE-SIDED ACCESS DEVICE AND FABRICATION METHOD THEREOF

BACKGROUND OF THE INVENTION

1. Field of the Invention

The present invention relates to a single-sided access device for $4F^2$ DRAM cell. More particularly, the present invention relates to a single-sided T-gate fin field-effect-transistor (FinFET) or single-gate FinFET with improved device control and access drive current, and a method for making the same.

2. Description of the Prior Art

As known in the art, dynamic random access memory (DRAM) is a type of random access memory that stores each bit of data in a separate capacitor within an integrated circuit. Typically, DRAM is arranged in a square array of one capacitor and transistor per cell. The transistor, which acts as switching device, comprises a gate and a silicon channel region underneath the gate. The silicon channel region is located between a pair of source/drain regions in a semiconductor substrate and the gate is configured to electrically connect the source/drain regions to one another through the silicon channel region.

A vertical double-gate fin field-effect-transistor (FinFET) has been developed for the next-generation $4F^2$ DRAM cell (F stands for minimum lithographic feature width). However, difficulties are frequently encountered in attempting to produce the vast arrays of vertical double-gate FinFET devices desired for semiconductor DRAM applications while maintaining suitable performance characteristics of the devices. For example, recently DRAM manufacturers face a tremendous challenge on shrinking the memory cell area as the word line spacing, i.e., the spacing between two adjacent word lines, continues to shrink. For high-speed DRAM applications, electrical coupling effect may be a problem as the spacing between two closely arranged word lines continues to shrink.

In light of the above, there is a strong need in this industry to provide a novel FinFET structure and the fabrication process thereof in order to avoid the aforesaid problems.

SUMMARY OF THE INVENTION

To address these and other objects and in view of its purposes, the present invention provides a single-sided access device including an active fin structure comprising a source region and a drain region; an insulating layer interposed between the source region and the drain region; a trench isolation structure disposed at one side of the active fin structure; a single-sided sidewall gate electrode disposed on the other side of the active fin structure and being opposite to the trench isolation structure so that the active fin structure is sandwiched by trench isolation structure and the single-sided sidewall gate electrode; and a gate protrusion laterally and electrically extended from the single-sided sidewall gate electrode and embedded between the source region and the drain region under the insulating layer.

According to another aspect, the invention provides a DRAM array including an array of single-sided access devices. Each of the single-sided access devices comprises an active fin structure comprising a source region and a drain region; an insulating layer interposed between the source region and the drain region; a trench isolation structure disposed at one side of the active fin structure; a single-sided sidewall gate electrode disposed on the other side of the active fin structure and being opposite to the trench isolation structure so that the active fin structure is sandwiched by trench isolation structure and the single-sided sidewall gate electrode; and a gate protrusion laterally and electrically extended from the single-sided sidewall gate electrode and embedded under the insulating layer between the source region and the drain region.

According to yet another aspect, the invention provides a DRAM array, characterized by an array of single-sided access devices as described above. The DRAM array comprises two mirror symmetrical single-gate fin field-effect-transistors arranged in two adjacent columns and in the same row of the DRAM array.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
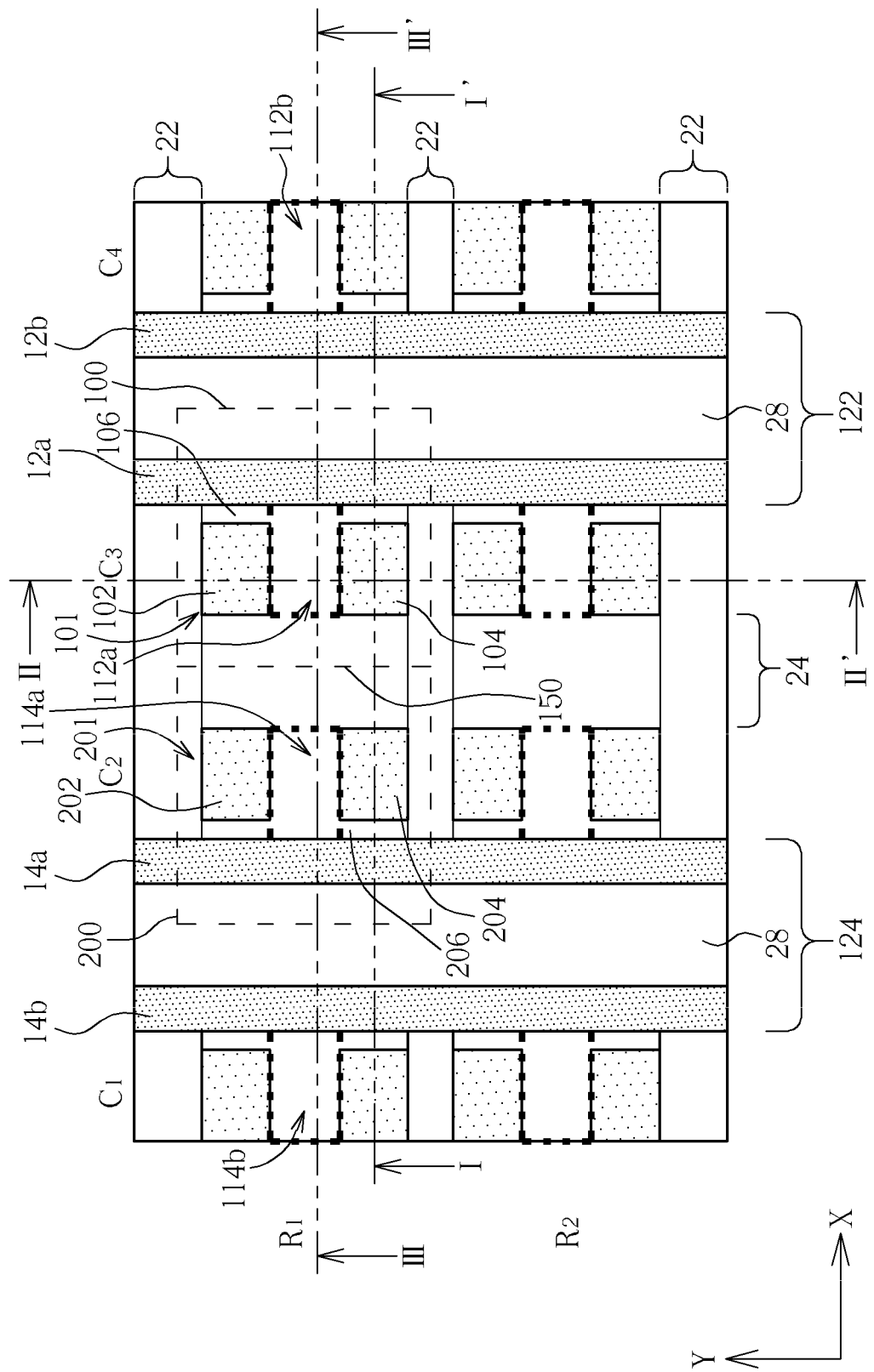
FIG. 1 is a schematic layout diagram showing a portion of an exemplary DRAM array in accordance with one preferred embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

The term "horizontal" as used herein is defined as a plane parallel to the conventional major plane or primary surface of the semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 2A:
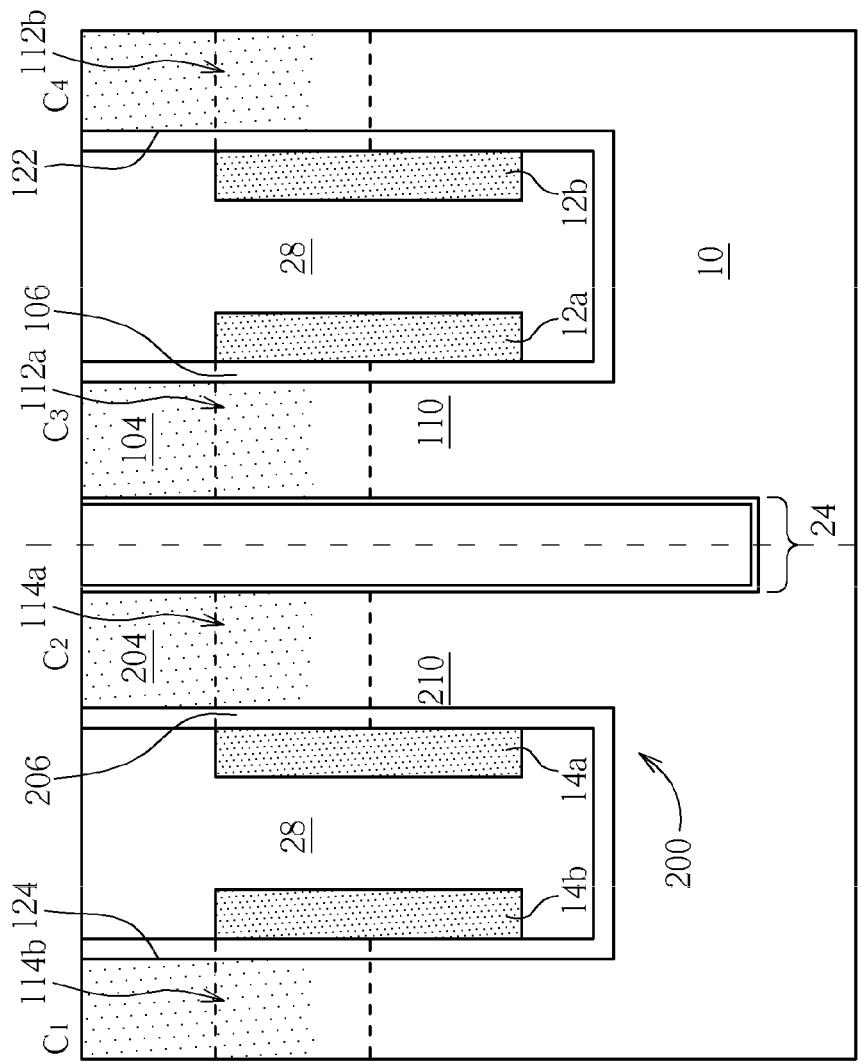
FIG. 2A shows schematic, cross-sectional view of the single-gate FinFETs of the invention, which is taken along line I-I' (reference x-axis direction) of FIG. 1.
Figure 2B:
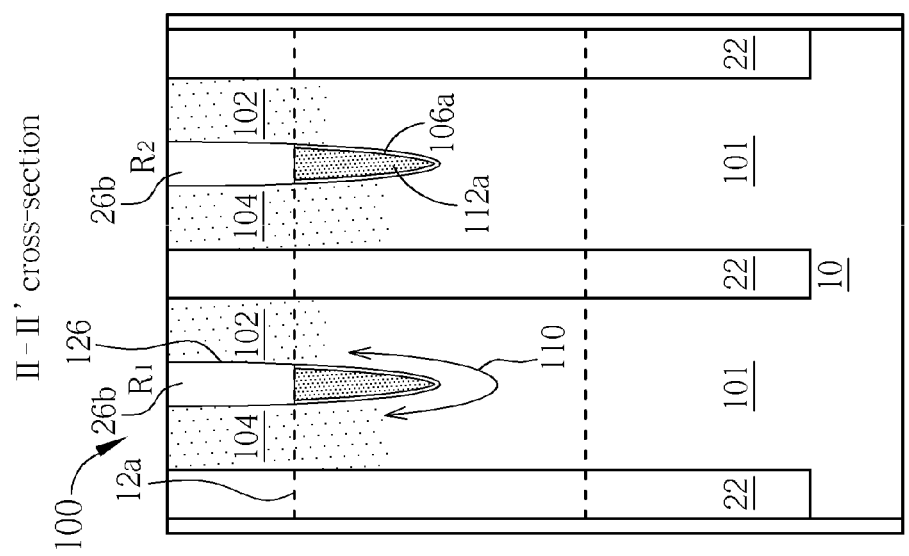
FIG. 2B shows schematic, cross-sectional view of the single-gate FinFETs of the invention, which is taken along line II-II' (reference y-axis direction) of FIG. 1.
Figure 2C:
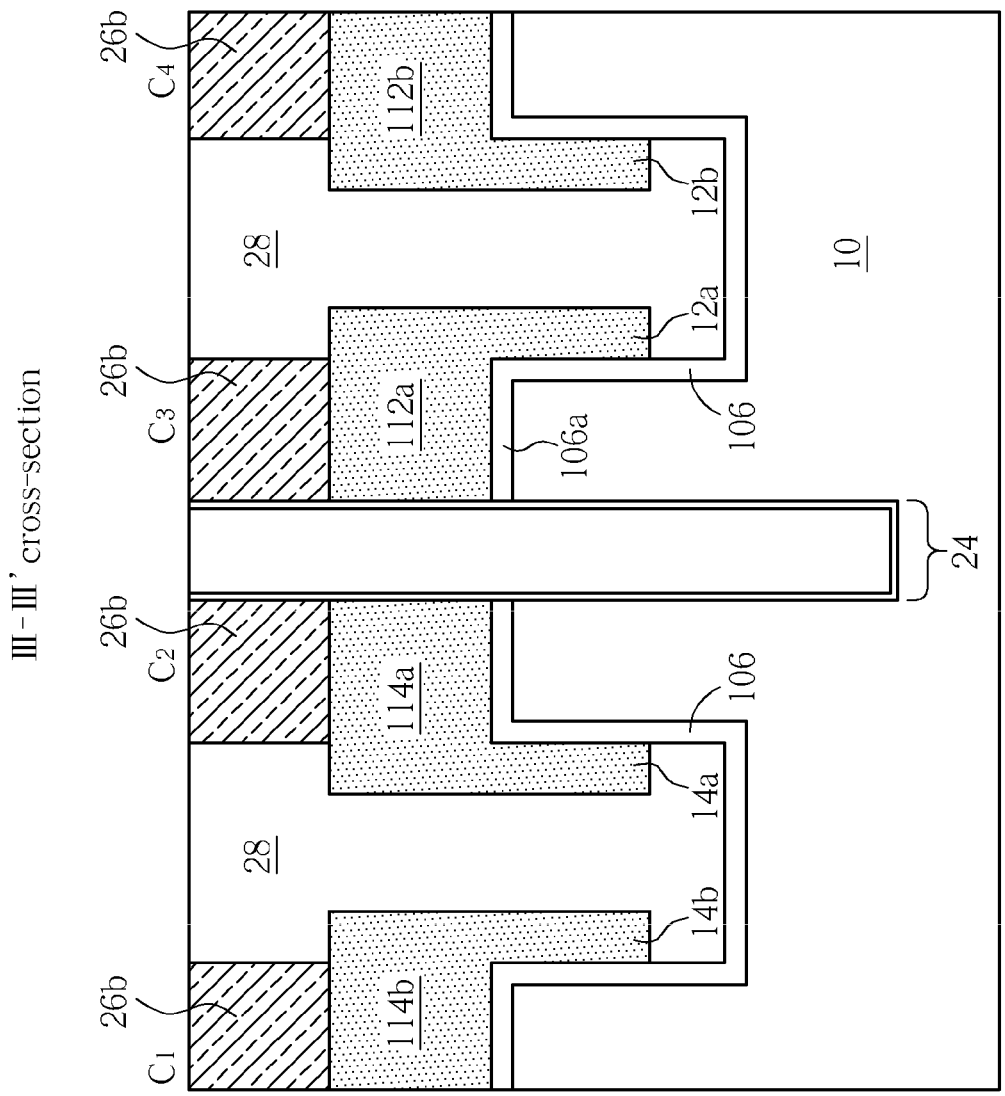
FIG. 2C is a schematic, cross-sectional view of the single-gate FinFETs of the invention, which is taken along line III-III' (reference x-axis direction) of FIG. 1.

Please refer to FIG. 1 and FIGS. 2A-2C. FIG. 1 is a schematic layout diagram showing a portion of an exemplary DRAM array in accordance with one preferred embodiment of this invention. FIG. 2A shows schematic, cross-sectional view of the single-gate FinFETs of the invention, which is taken along line I-I' (reference x-axis direction) of FIG. 1. FIG. 2B shows schematic, cross-sectional view of the single-gate FinFETs of the invention, which is taken along line II-II' (reference y-axis direction) of FIG. 1. FIG. 2C is a schematic, cross-sectional view of the single-gate FinFETs of the invention, which is taken along line III-III' (reference x-axis direction) of FIG. 1. As shown in FIG. 1 and FIG. 2A, the demonstrated portion of the DRAM array comprises eight single-gate FinFETs arranged in four columns (C1~C4) and two rows (R1 and R2), including single-gate FinFET 100 and single-gate FinFET 200, for example, which are arranged in the same row (R1) and in two adjacent columns (C2 and C3 respectively).

The single-gate FinFETs 100 and 200, which are formed in the active fin structures 101 and 201, are indicated by the dotted line and are arranged in close proximity to each other. According to the embodiment of the invention, each single-gate FinFET and a corresponding capacitor element (not shown) can be configured as a DRAM cell with a device area of $4F^2$ or even smaller. Sidewall word lines 12a, 12b, 14a and 14b, which extend along the reference y-axis, are provided next to each column of transistors. The single-gate FinFET 100 and the single-gate FinFET 200 are mirror symmetrical to each other with respect to a central plane 150. The single-gate FinFET 100 is electrically isolated from the single-gate FinFET 200 by a line-shaped trench isolation structure 24 that extends along the reference y-axis direction. The trench isolation structure 24 is disposed on a side of the active fin structure 101 or 201 opposite to the sidewall word line 12a or 14a. As can be seen in II-II' cross-section of FIG. 2B, each of the active fin structures, e.g. the active fin structure 101, is a tuning fork-shaped silicon island with an insulating layer 26b interposed between the two source/drain regions 102 and 104.

The sidewall word lines 12a and 12b are embedded in a line-shaped trench 122 and are disposed on two opposite sidewalls of the line shaped trench 122. The sidewall word lines 14a and 14b are embedded in a line-shaped trench 124 and are disposed on two opposite sidewalls of the line shaped trench 124. The sidewall word line 12a that passes the active fin structure 101 acts as a single-sided sidewall gate electrode of the single-gate FinFET 100 and the sidewall word line 14a that passes the active fin structure 201 acts as a single-sided sidewall gate electrode of the single-gate FinFET 200. The line-shaped trenches 122 and 124 may be filled with insulating layer 28 such as silicon oxide or the like.

As shown in FIG. 1 and FIG. 2C, the sidewall word lines 12a, 12b, 14a, 14b further include a plurality of gate protrusions 112a, 112b, 114a, 114b, respectively, which laterally extend from a single side of each of the sidewall word lines 12a, 12b, 14a, 14b. The plurality of gate protrusions 112a, 112b, 114a, 114b, which are indicated with dotted lines in FIG. 1, are formed integrally with the sidewall word lines 12a, 12b, 14a, 14b respectfully. Each of the gate protrusions 112a, 112b, 114a, 114b and the respective sidewall word lines 12a, 12b, 14a, 14b may function as a T-shaped gate of each of the single-gate FinFETs, which improves the access drive current and off state leakage of the single-gate FinFETs. It is one germane feature of this invention that each of the gate protrusions 112a, 112b, 114a, 114b is embedded in the lower part of a recessed trench 126 between the source region and the drain region of each single-gate FinFET and is capped with the insulating layer 26b such as high-density plasma chemical vapor deposition (HDPCVD) oxide, as shown in II-II' cross-section of FIG. 2B.

For example, the single-gate FinFET 100, which is fabricated in the active fin structure 101, comprises two source/drain regions 102 and 104 spaced apart from each other, a recessed, U-shaped channel 110 under the two source/drain regions 102 and 104, the word line 12a that acts as a gate electrode, a gate dielectric layer 106 between the U-shaped channel 110 and the word line 12a, the gate protrusion 112a of the word line 12a, and a gate dielectric layer 106a between the gate protrusion 112a and the U-shaped channel 110. Likewise, the single-gate FinFET 200, which is fabricated in the active fin structure 201, comprises two source/drain regions 202 and 204 spaced apart from each other, a recessed, U-shaped channel 210 under the two source/drain regions 202 and 204, the word line 14a that acts as a gate electrode, a gate dielectric layer 206 between the U-shaped channel 210 and the word line 14a, the gate protrusion 114a of the word line 14a, and a gate dielectric layer (not shown) between the gate protrusion 114a and the U-shaped channel 210.

FIGS. 3-7 are schematic diagrams showing the process of fabricating the single-gate FinFET in accordance with one embodiment of the present invention, wherein like numeral numbers designate like layers, regions or elements.

Figure 3:
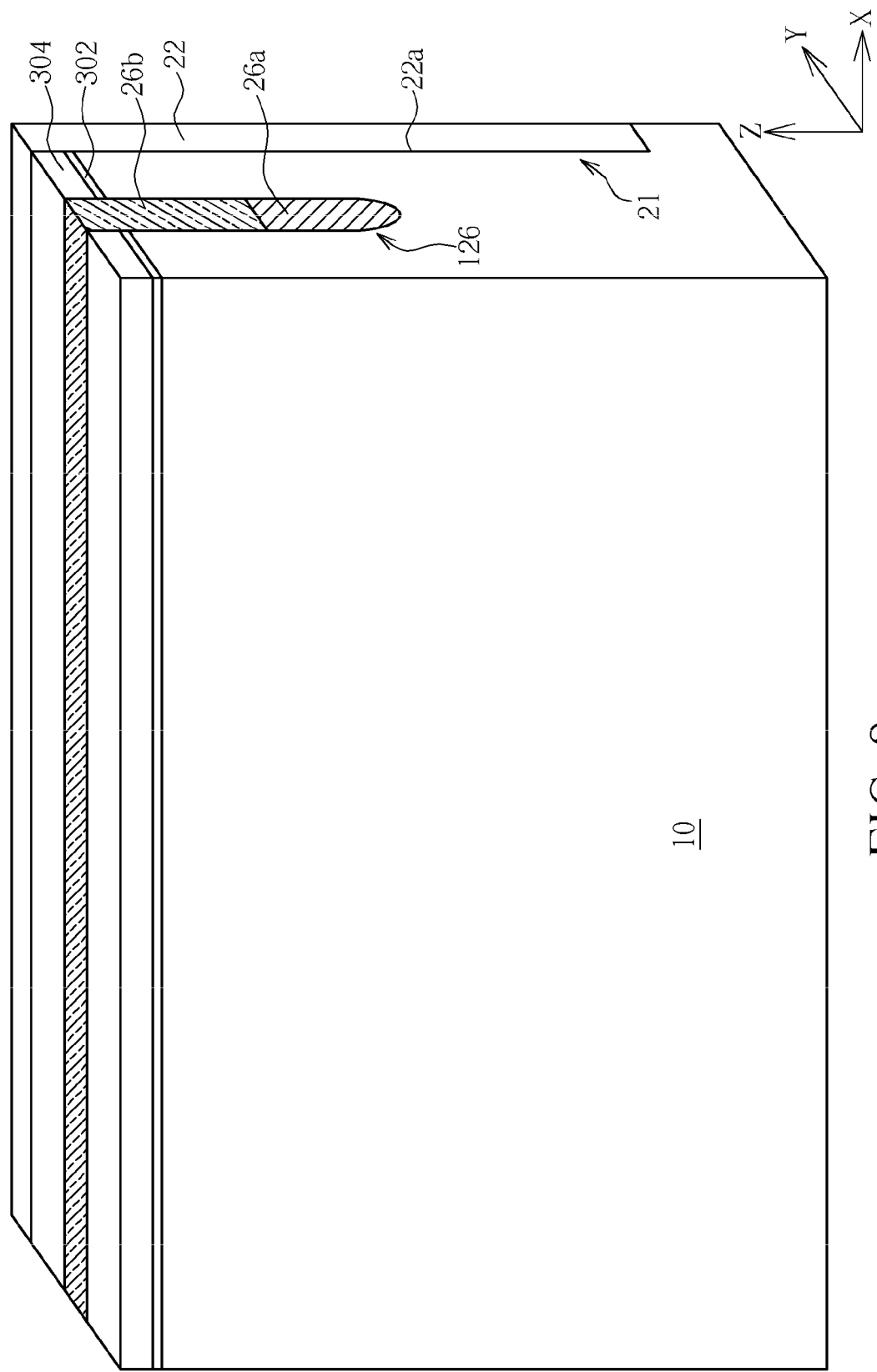
FIGS. 3-7 are schematic diagrams showing the process of fabricating the single-gate FinFET in accordance with one embodiment of the present invention.

As shown in FIG. 3, a substrate 10 is provided. The substrate 10 may be a semiconductor substrate including but not limited to silicon substrate, silicon substrate with an epitaxial layer, SiGe substrate, silicon-on-insulator (SOI) substrate, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. A pad oxide layer 302 and a pad nitride layer 304 may be formed over the primary surface of the substrate 10. An STI process is then carried out to form line-shaped STI regions 22 embedded in the substrate 10. The line-shaped STI regions 22 provide electrical isolation between two adjacent rows of devices. According to the embodiment of the invention, each of the line-shaped STI regions 22 extends along the reference x-axis direction. The line-shaped STI regions 22 may be formed by spin-on-dielectric (SOD) gap-fill methods. A lining layer 22a may be formed in the STI trench 21. The lining layer 22a may comprise silicon oxide, silicon nitride or combination thereof. Preferably, the lining layer 22a comprises a silicon oxide layer (not explicitly shown) formed on interior surface of the STI trench 21 and a silicon nitride layer (not explicitly shown) on the silicon oxide layer. The lining layer 22a prevents SOD gap filling material from consuming the substrate 10.

Subsequently, a line-shaped recessed trench 126 is formed in the substrate 10 between two source/drain regions. The recessed trench 126 also extends along the reference x-axis direction between two STI trenches 21. After the formation of the recessed trench 126, an sacrificial layer 26a such as low-quality oxide is formed by SOD gap-fill process. For example, the SOD gap-fill process for forming the sacrificial layer 26a is carried out with low overburden and is densified at relatively low temperatures (≤400° C.). Therefore, only 20-30 Å oxide will be grown in the recessed trench 126. Subsequently, an SOD recess process such as wet etching or dry etching process is performed to remove an upper portion of the SOD filler from the recessed trench 126. The remaining SOD filler is less than or equal to 50% of the trench height. It is to be understood that the sacrificial layer 26a may be composed of conductive materials such as titanium nitride (TiN) which can be removed by SC1 clean before the gate oxidation. In a case that the sacrificial layer 26a is composed of conductive material like TiN it has to be removed at pre-gate oxide clean without etching out the other materials such as silicon, nitride or oxide.

After the formation of the sacrificial layer 26a, an insulating layer 26b such as high-quality oxide is deposited into the remaining space in the recessed trench 126 by HDPCVD methods. Thereafter, the entire surface of the substrate 10 is subjected to polishing process such as chemical mechanical process, and the pad oxide layer 302 and the pad nitride layer 304 are removed. According to the embodiment of this invention, the etching rate of the sacrificial layer 26a is higher than that of the insulating layer 26b. It is understood that other two-step gap fill processes may be utilized to form the stack structure including the sacrificial layer 26a and the insulating layer 26b having different oxide quality and etching rates.

Figure 4:
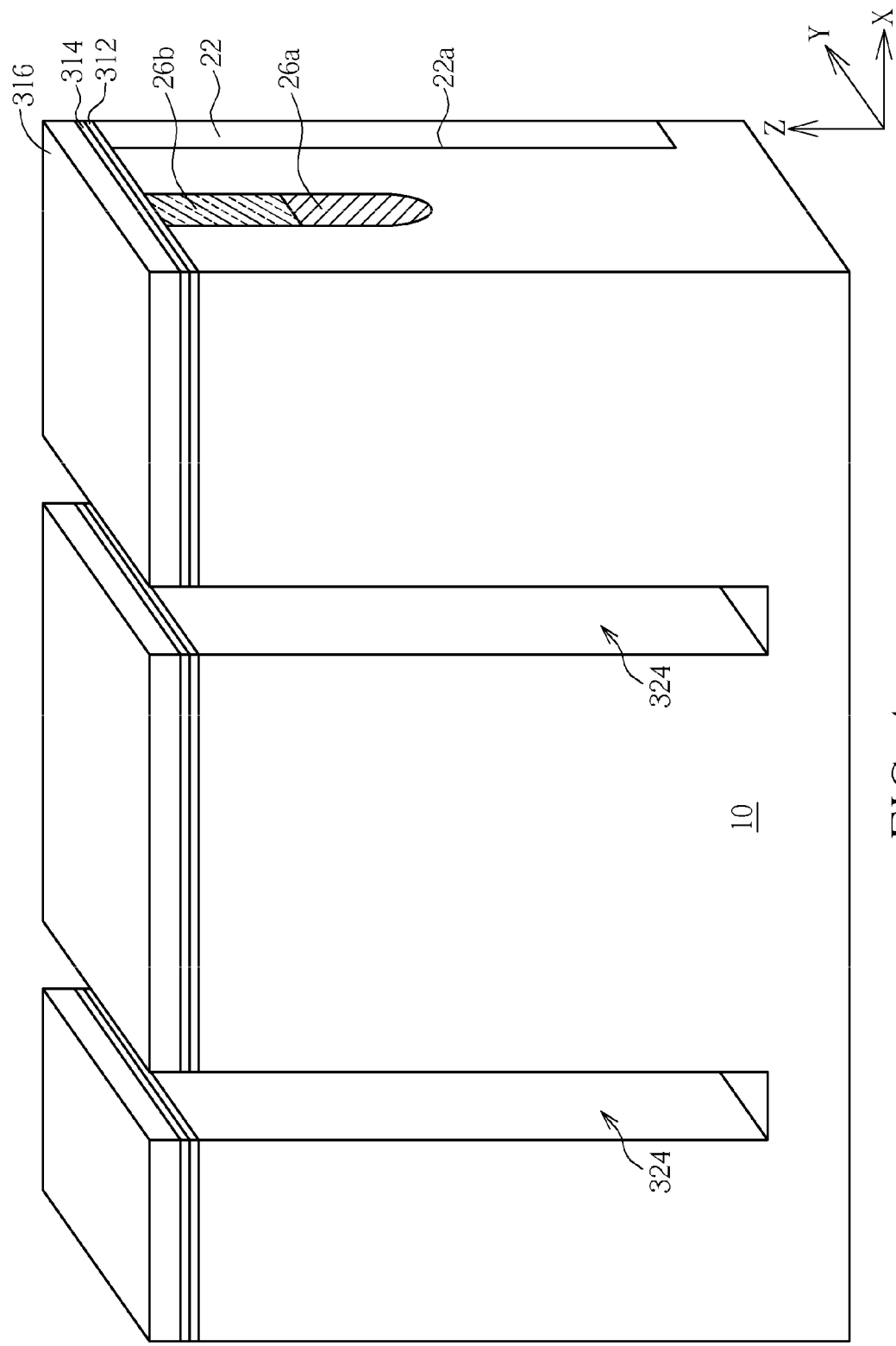

As shown in FIG. 4, a silicon oxide layer 312, a silicon nitride layer 314 and a polysilicon hard mask 316 may be formed on the planar surface of the substrate 10 after the removal of the pad oxide layer 302 and the pad nitride layer 304. A lithographic process and dry etching process are carried out to form line-shaped trenches 324 that extend along the reference y-axis direction. The line-shaped STI regions 22 and the insulation region 26 are intersected with the line-shaped trenches 324.

Figure 5:
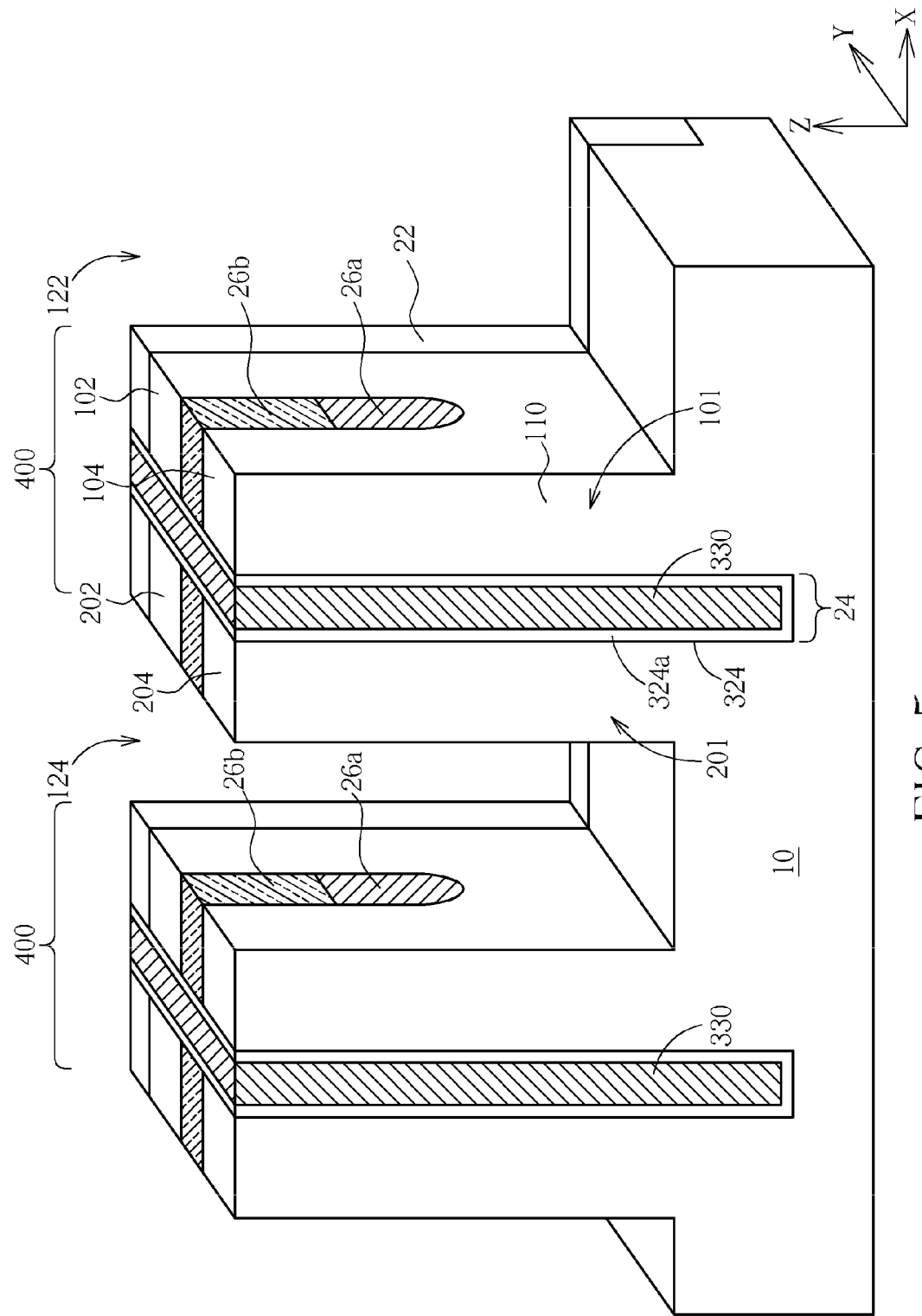

As shown in FIG. 5, a lining layer 324a is then formed on the interior surface of the line-shaped trenches 324, including the sidewall and bottom surface of the line-shaped trenches 324. According to the embodiment of the invention, the lining layer 324a may comprise silicon oxide, silicon nitride, composite of silicon oxide and silicon nitride, or any other materials. Subsequently, an SOD gap-filler (not shown) is coated on the substrate 10 and fills up the line-shaped trenches 324. The SOD gap filler may comprise polysilazane precursor but not limited thereto. A curing or densification process may be carried out to transform the SOD gap filler into silicon oxide gap filler 330. For example, the curing process may be carried out at high temperatures (e.g. 800-1000° C.) with the presence of steam. A CMP process may be carried out to remove the excess silicon oxide gap filler 330 outside the line-shaped trenches 324.

After the formation of the trench isolation structure 324, the polysilicon hard mask 316 may be removed from the surface of the substrate 10. An anisotropic dry etching process may be carried out to etch away a portion of the silicon nitride layer 314, the silicon oxide layer 312 and the substrate 10, thereby forming a line-shaped protruding structure 400 and line-shaped trenches 122 and 124 on the two opposite sides of the line-shaped protruding structure 400, which extend along the reference y-axis direction. The active fin structures 101 and 201 are formed in the line-shaped protruding structure 400. More specifically, the line-shaped protruding structure 400, which extends along the reference y-axis direction, comprises the active fin structures 101 and 201, the silicon oxide gap filler 330 between the active fin structures 101 and 201, the lining layer 324a, the sacrificial layer 26a and insulating layer 26b between the source region 102 or 202 and the drain region 104 or 204, and the line-shaped STI region 22.

Figure 6:
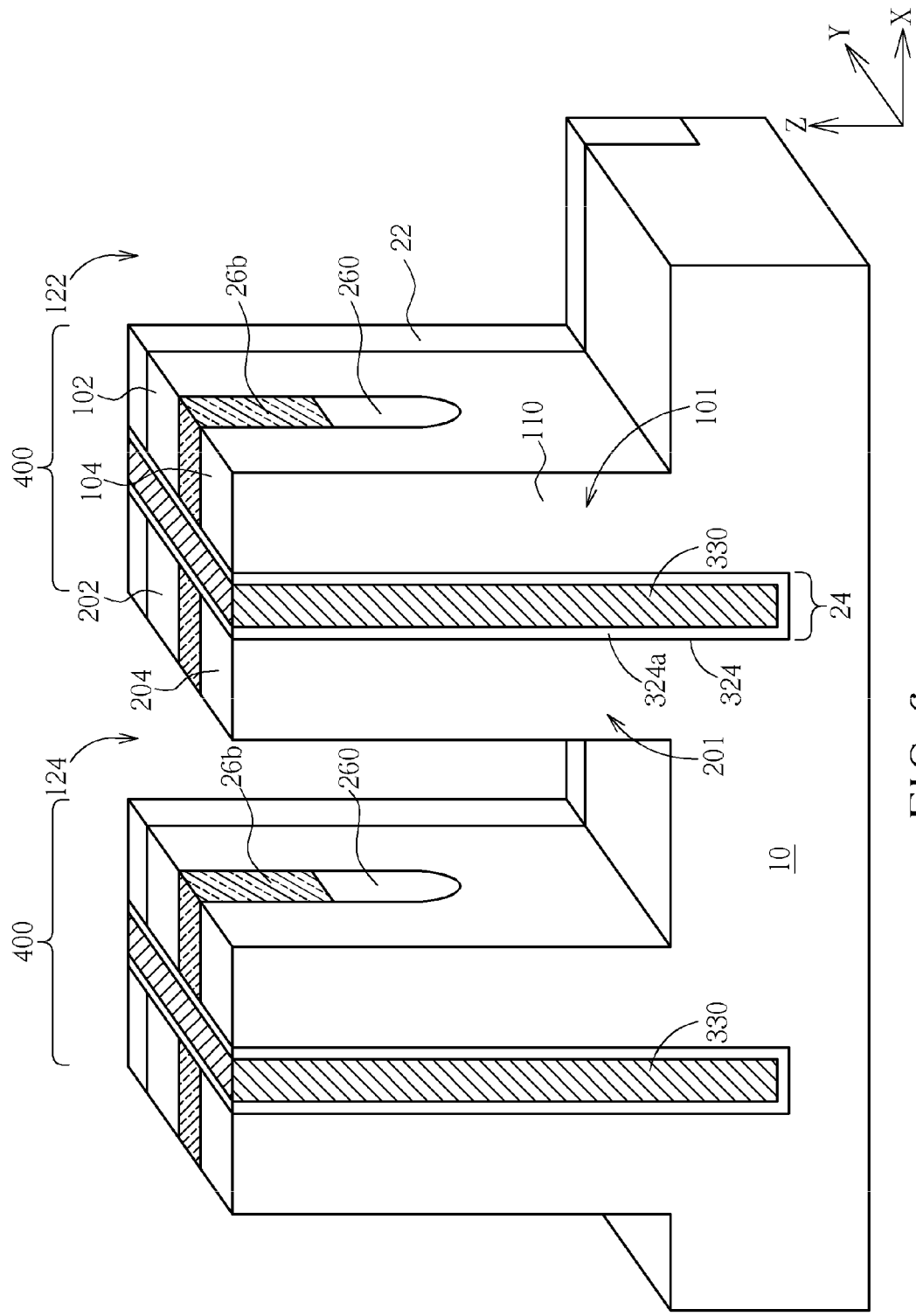

As shown in FIG. 6, after the formation of the line-shaped trenches 122 and 124, a gate oxide pre-clean process is carried out to remove native oxide and residuals from the silicon surface. At the same time, the sacrificial layer 26a is also removed selectively, thereby forming a cavity 260 under the insulating layer 26b. The aforesaid gate oxide pre-clean process may use diluted HF (DHF) or any suitable cleaning methods. Since the etching rate of the sacrificial layer 26a is higher than that of the insulating layer 26b, the insulating layer 26b remains substantially intact during the gate oxide pre-clean process. In the cavity 260, a portion of the lining layer 324a of the trench isolation structure 24 may be exposed at this point.

Figure 7:
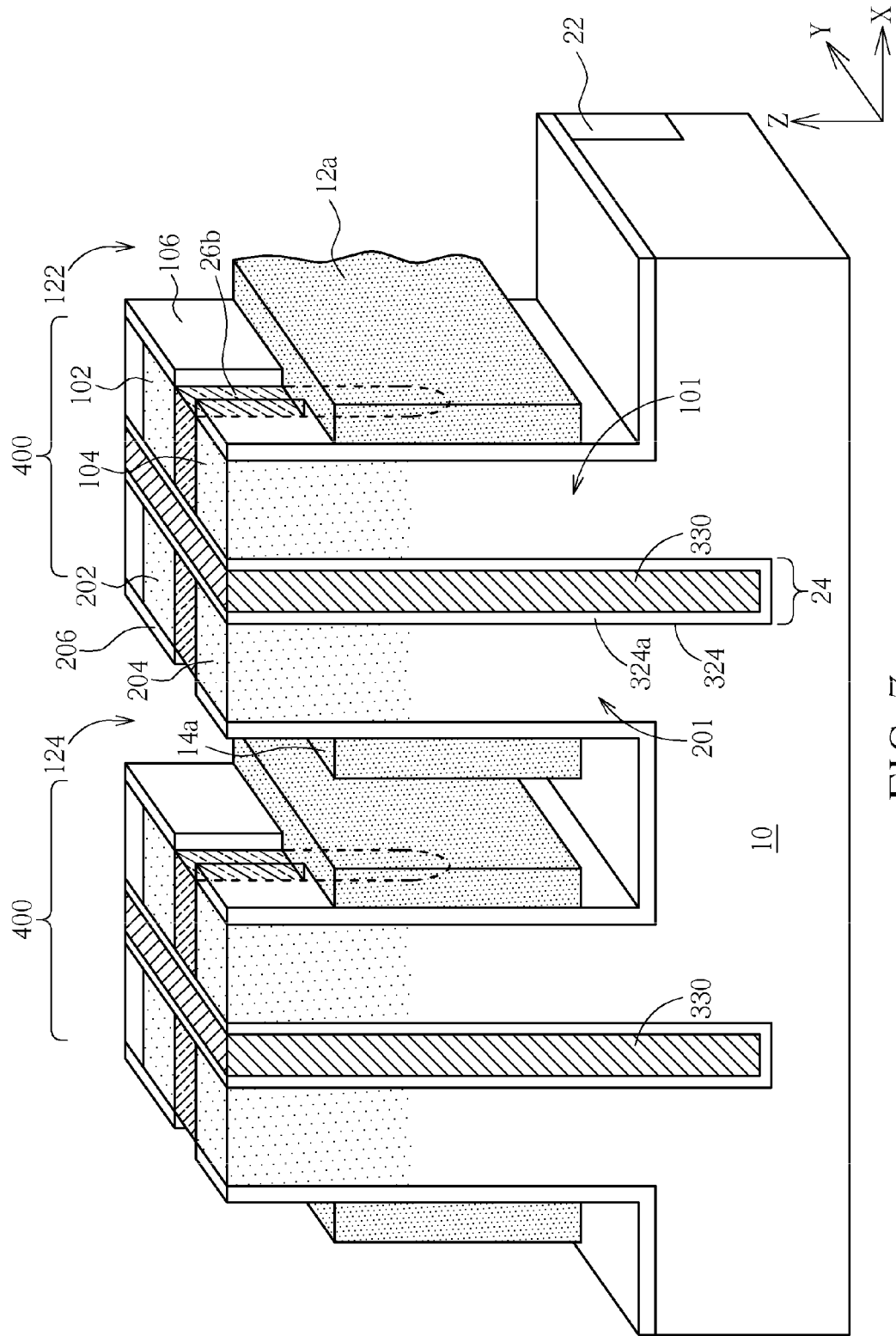

As shown in FIG. 7, a gate dielectric layer 106 and a gate dielectric layer 206 are formed on the two opposite sidewalls of the line-shaped protruding structure 400. A gate dielectric layer 106a is formed in the cavity 260. The gate dielectric layer 106, the gate dielectric layer 106a and the gate dielectric layer 206 may be formed by in-situ steam growth (ISSG) or any other suitable methods known in the art. Subsequently, sidewall word lines 12a and 14a, for example, are formed on the two opposite sidewalls of the line-shaped protruding structure 400. The sidewall word lines 12a and 14a, which may be composed of metals such as TiN, polysilicon or any suitable conductive materials, also fills the cavity 260 to form gate protrusions (not explicitly shown in FIG. 8) under the insulating layer 26b. Thereafter, the line-shaped trenches 122 and 124 may be filled with insulating dielectrics, and then planarized. Finally, source/drain ion implantation are carried out to dope the source/drain landing areas 102, 104, 202 and 204.

Those skilled in the art will readily observe that numerous modifications and alterations of the device and method may be made while retaining the teachings of the invention.

What is claimed is:

1. A single-sided access device, comprising:
an active fin structure of a substrate, the active fin structure comprising a source region and a drain region, wherein the active fin structure has a longitudinal direction that is parallel to a top surface of the substrate;
an insulating layer interposed between the source region and the drain region and embedded in the active fin structure;
a trench isolation structure disposed at one side of the active fin structure;
a sidewall gate electrode extending along the longitudinal direction on the other side of the active fin structure and being opposite to the trench isolation structure so that the active fin structure is sandwiched by trench isolation structure and the sidewall gate electrode; and
a gate protrusion laterally and electrically extended from the sidewall gate electrode and embedded under the insulating layer between the source region and the drain region, wherein the gate protrusion penetrating through entire thickness of the active fin structure and is in direct contact with the trench isolation structure.

2. The single-sided access device according to claim 1, wherein the gate protrusion is integrally formed with the single-sided sidewall gate electrode.

3. The single-sided access device according to claim 1 further comprising a U-shaped channel between the source region and the drain region.

4. The single-sided access device according to claim 1 further comprising a first gate dielectric layer between the single sidewall gate electrode and the active fin structure.

5. The single-sided access device according to claim 4 further comprising a second gate dielectric layer between the gate protrusion and the active fin structure.

6. The single-sided access device according to claim 1, wherein the insulating layer comprises high-density plasma chemical vapor deposition (HDPCVD) oxide.

7. The single-sided access device according to claim 1, wherein the single-sided sidewall gate electrode extends along a first direction.

8. The single-sided access device according to claim 7, wherein the trench isolation structure is a line-shaped isolation structure and extends along the first direction.

9. The single-sided access device according to claim 7, wherein the gate protrusion extends along a second direction that is not parallel with the first direction.

10. The single-sided access device according to claim 9, wherein the first direction is substantially perpendicular to the second direction.

11. A DRAM array, comprising:
a substrate;
an array of access devices in the substrate, each of the access devices comprising:
an active fin structure comprising a source region and a drain region, wherein the active fin structure has a longitudinal direction that is parallel to a top surface of the substrate;
an insulating layer interposed between the source region and the drain region and embedded in the active fin structure;
a trench isolation structure disposed at one side of the active fin structure;
a sidewall gate electrode extending along the longitudinal direction on the other side of the active fin structure and being opposite to the trench isolation structure so that the active fin structure is sandwiched by trench isolation structure and the sidewall gate electrode; and
a gate protrusion laterally and electrically extended from the sidewall gate electrode and embedded under the insulating layer between the source region and the drain region, wherein the gate protrusion extends penetrating through entire thickness of the active fin structure and is in direct contact with the trench isolation structure.

12. The DRAM array according to claim 11, wherein the gate protrusion is integrally formed with the single-sided sidewall gate electrode.

13. The DRAM array e according to claim 11 further comprising a U-shaped channel between the source region and the drain region.

14. The DRAM array according to claim 11 further comprising a first gate dielectric layer between the single sidewall gate electrode and the active fin structure.

15. The DRAM array according to claim 11 further comprising a second gate dielectric layer between the gate protrusion and the active fin structure.

16. The DRAM array according to claim 11, wherein the insulating layer comprises high-density plasma chemical vapor deposition (HDPCVD) oxide.

17. The DRAM array according to claim 11, wherein the single-sided sidewall gate electrode extends along a first direction.

18. The DRAM array according to claim 17, wherein the trench isolation structure is a line-shaped isolation structure and extends along the first direction.

19. The DRAM array according to claim 17, wherein the gate protrusion extends along a second direction that is substantially perpendicular to the first direction.

20. The DRAM array according to claim 11 comprising two mirror symmetrical single-gate fin field-effect-transistors arranged in two adjacent columns and in the same row of the DRAM array.

\* \* \* \* \*